United States Patent [19]
Toyoda et al.

[11] Patent Number: 5,892,286
[45] Date of Patent: Apr. 6, 1999

[54] SEMICONDUCTOR DEVICE AND MANUFACTURING METHOD THEREOF

[75] Inventors: Yoshihiko Toyoda; Takeshi Mori; Tetsuo Fukada; Makiko Hasegawa, all of Tokyo, Japan

[73] Assignee: Mitsubishi Denki Kabushiki Kaisha, Tokyo, Japan

[21] Appl. No.: 759,999

[22] Filed: Dec. 3, 1996

[30] Foreign Application Priority Data

Jun. 26, 1996 [JP] Japan ................................. 8-166106

[51] Int. Cl.⁶ .......................... H01L 23/48; H01L 23/52; H01L 29/40
[52] U.S. Cl. .......................... 257/775; 257/773; 257/666
[58] Field of Search ....................... 257/773, 775, 257/762, 666, 751; 438/669, 670, 673, 674, 730

[56] References Cited

U.S. PATENT DOCUMENTS

| 4,847,674 | 7/1989 | Sliwa et al. . |
| 4,944,836 | 7/1990 | Beyer et al. ............................ 156/645 |
| 5,306,665 | 4/1994 | Manabe . |
| 5,530,285 | 6/1996 | Brenndoefer . |

OTHER PUBLICATIONS

"Advanced Metallization for ULSI Applications in 1993", *Materials Research Society, 1993*, Favreau et al., pp. 1–11.
"Wiring Technique of High Speed Processing Device", *The 41st VLSI FORUM Report*, Nov. 28, 1995.

*Primary Examiner*—Mahshid D. Saadat
*Assistant Examiner*—S. V. Clark
*Attorney, Agent, or Firm*—McDermott, Will & Emery

[57] ABSTRACT

To form a plurality of patterned conductor leads in the same layer of an integrated circuit, an insulating film is etched to form a plurality of patterned grooves by plasma etching using an etching gas containing carbon and fluorine to which an additive gas containing carbon is added. The etching rate is substantially proportional to the groove width, so that the groove depth is substantially proportional to the groove width. Grooves are filled with a conductive material to form patterned conductor leads. Thus, an aspect ratio of the patterned conductor leads is kept in a certain range, resulting in an improvement in yield and reliability of the conductor leads. The conductor leads formed of material containing copper are coated with a diffusion preventive film.

18 Claims, 10 Drawing Sheets

SEMICONDUCTOR DEVICE AND MANUFACTURING METHOD THEREOF

FIELD OF THE INVENTION

The present invention relates to a semiconductor device having a plurality of patterned conductor leads in a conductor lead layer and manufacturing method thereof.

DESCRIPTION OF BACKGROUND ART

Patterned conductor leads are used in a semiconductor device such as an integrated circuit in a variety of ways such as grounding wire, power supply conductor, signal conductor, etc. The width of such patterned conductor leads is varied corresponding to the respective use. Accordingly, a plurality of conductor leads having varied widths are formed in the same conductor lead layer. On the other hand, the height of each patterned conductor lead is the same value determined by the film thickness formed for each conductor lead. Thus, a large difference arises in the ratio of height to width of the conductor leads, i.e., the aspect ratio of patterned conductor leads formed in the same layer.

Figure 14:
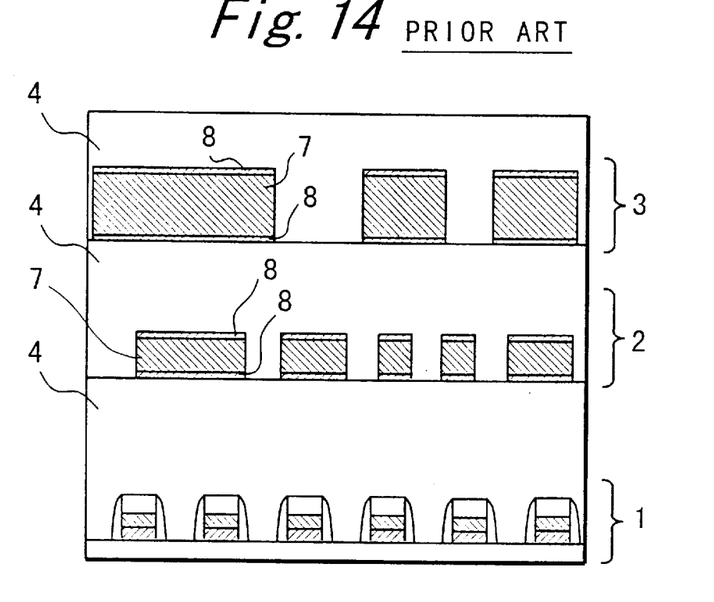
FIG. 14 illustrates a cross sectional view of a convention conductor lead structure of a semiconductor device.

FIG. 14 is a sectional view of conventional patterned conductor leads disclosed in page 5 of "Advanced Metallization for VLSI Applications in 1993". In the drawing, transistors 1 are formed on a Si substrate, and interlayer insulating films 4 composed of $SiO_2$ are disposed. Then, a first conductor lead layer 2 is formed, in which a principal conductor material 7 such as AlSi and an adhesion layer 8 such as TiN are laminated. This layer is formed by successive sputtering of lead material on the interlayer insulating film 4, followed by reactive ion etching (RIE) via a resist mask thereon. Then, a further interlayer film 4 may be formed thereon, and a second conductor lead layer 3 may be formed similarly. It is possible to further stack a conductor lead layer thereon.

Conductor leads in the first conductor lead layer 2 have the same height and different width, therefore an aspect ratio (i.e, ratio of height to width) of each conductor lead is quite different. The difference in aspect ratio occurs likewise among the conductor leads in the second conductor lead layer 3. It is difficult to etch the patterned conductor lead material in the same depth by reactive ion etching (because of such a large difference in aspect ratio). Thus, deficient etching and short-circuit between patterned conductor leads results.

Figure 15:
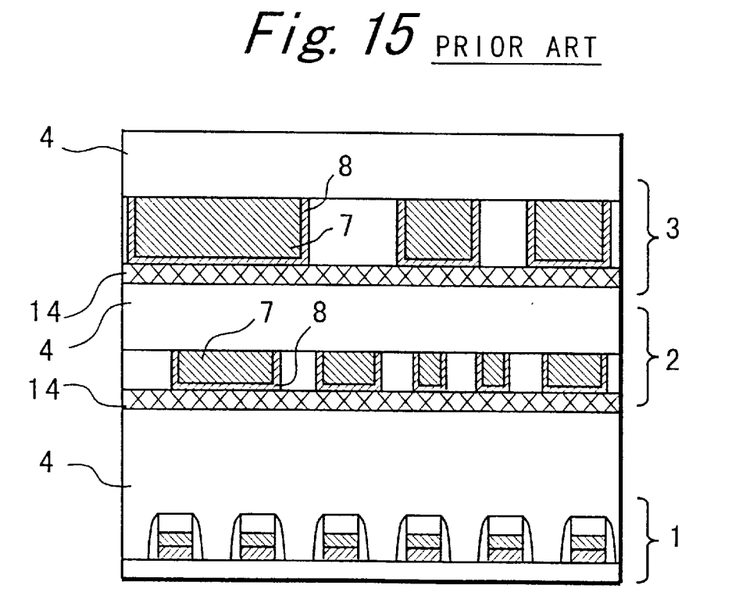
FIG. 15 illustrates a cross sectional view of another conventional conductor lead structure of a semiconductor device.

Recently, a method for forming patterned conductor leads was proposed in which patterned grooves were filled with conductor lead material (i.e., buried conductor leads). FIG. 15 is a sectional view of another conventional conductor lead shown on page 39 of the 41st VLSI FORUM titled "Wiring Technique of High Speed Processing Device" (Japanese publication). In the drawings, transistors 1 are formed on a Si substrate, and an interlayer insulating film 4, generally composed on $Sio_2$, is disposed thereon. Then, an etching stopper 14, generally composed of SiN, is formed. When grooves are formed in an interlayer insulating material 4, etching is substantially stopped by the etching stopper 14. In a first conductor lead layer 2, an adhesion layer 8, such as TiN, is formed with good coverage. Next, the grooves are filled with principal conductor material 7, such as AlSi. Then, the conductor lead materials formed outside the groove portions are removed, whereby the patterned conductor leads are formed. In this conventional process, since the etching stopper of insulating film is formed, depth of the grooves is constant. Accordingly, the aspect ratio of the patterned conductor leads formed in the same conductor lead layer are largely different.

Figure 16:
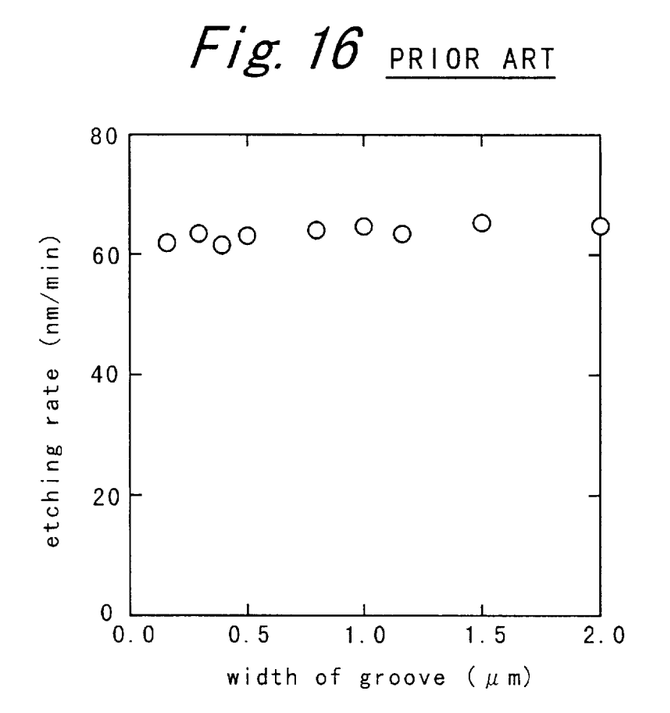
FIG. 16 shows the relation of the groove width and etching rates in a conventional manufacturing method of a conductor lead structure of a semiconductor device.

In the manufacturing method of the conventional buried conductor leads, etching rate or etching speed is substantially constant irrespective of the width of grooves, and as a result, the aspect ratio of the formed conductor leads is largely different. FIG. 16 shows a relation between the width of the groove and the etching rates. The $SiO_2$ layer is etched by RIE using $CHF_3$ (of 30 sccm in flow rate) as an etching gas, and AR (of 30 sccm in flow rate) and $O_2$ (of 5 sccm in flow rate) mixed gas as an additive gas. It is understood from the drawing that the etching rate is substantially constant irrespective of the groove width. Because of large differences in the aspect ratio of conventional buried conductor leads, it is difficult to bury conductor lead material in deep grooves, resulting in deficient burying and defective conductor leads.

Therefore, the width of conductor leads formed in the same conductor lead layer are limited to a small range depending on the film thickness of the conductor leads. As a result, it is impossible to form conductor leads having a large variety of width in the same conductor lead layer. Alternatively, the film thickness of the conductor leads can not be increased in a conductor lead layer where fine conductor leads are formed.

DISCLOSURE OF THE INVENTION

An object of the present invention is, therefore, to provide a semiconductor device and manufacturing method thereof, in which the aspect ratio of a plurality of conductor leads, formed in the same layer, is substantially constant or in a certain range.

According to one aspect of the present invention, a semiconductor device has a plurality of patterned conductor leads formed in the same layer, wherein the height of the patterned conductor leads increases with an increasing width thereof.

In another aspect of the present invention, the semiconductor device has a plurality of patterned conductor leads formed in the same layer, wherein the ratio of height to width of the patterned conductor leads is in a range of 0.6 to 1.6.

In another aspect of the present invention, the semiconductor device has a plurality of patterned conductor leads formed in the same layer, wherein the width of the patterned conductor leads is in a range of 0.3 to 5.0 μm, and the ratio of height to width of the patterned conductor leads is in a range of 0.6 to 1.6.

In another aspect of the present invention, the semiconductor device has a plurality of patterned conductor leads formed in the same layer, wherein the patterned conductor leads are composed of either copper or copper alloy coated by a diffusion preventive film.

In another aspect of the present invention, the semiconductor device has a plurality of patterned conductor leads formed in the same layer, wherein the patterned conductor leads are composed of either copper or copper alloy coated by a diffusion preventive film, and the diffusion preventive film is composed of a material selected from a metal of high melting point (i.e., a metal nitride, a silicon nitride or a metal oxide).

According to another aspect of the present invention, there is a method for manufacturing patterned conductor leads in a semiconductor device. A plurality of patterned grooves are formed on an insulating film via a resist mask formed thereon, by plasma etching using an etching gas containing carbon and fluorine to which an additive gas containing carbon is added. Then, the grooves are filled with conductive material to form conductive leads.

In another aspect of the present invention, there is a method for manufacturing a plurality of patterned conductor leads in a semiconductor device, wherein the etching gas includes at least one of $C_4F_8$, $CHF_3$ or $CF_4$ gas, and the additive gas includes at least one of CO, $CH_4$ or $C_2H_6$ gas.

In another aspect of the present invention, there is a method for manufacturing a plurality of patterned conductor leads in a semiconductor device, the conductive material formed outside of the grooves are removed either by chemical mechanical polishing or by dry etching.

In another aspect of the present invention, there is a method for manufacturing a plurality of patterned conductor leads in a semiconductor device, wherein the surface of the conductive material is coated by a diffusion preventive film.

Other features and advantages of the invention will be apparent from the following description.

DETAILED DESCRIPTION OF THE PREFERRED EMBODIMENT

In a manufacturing method, in accordance with the present invention, (of a semiconductor device having patterned conductor leads) such as an integrated circuit, a plurality of grooves are formed on an insulating film, via a resist mask formed thereon, by plasma etching using an etching gas containing carbon and fluorine, to which an additive gas containing carbon is added.

In the present invention, an etching rate is substantially proportional to the groove width as far as the width is within a certain range. Therefore, grooves may be formed to have a depth substantially proportional to the width, resulting in substantially a constant aspect ratio (i.e., the ratio of height to width of the groove).

In the present invention, even when there is a large variation in the width of patterned conductor leads in the range of 0.3 to 5 $\mu$m, i.e., by about 17 times the aspect ratio may remain in the range of 0.6 to 1.6. This ratio is moderate when compared with the large variation in the conductor lead width. This is because the height of the conductor leads is formed larger when the width of the conductor leads is increased.

It was acknowledged by the inventors that the relation between the groove width and the etching rate might be changed by changing reactive ion etching conditions. It was found that if the groove width exceeds a certain value, the etching rate becomes saturated. However, it was also acknowledged that the groove width where the etching rate becomes saturated is adjustable in the range of 0.5 to 5 $\mu$m.

As for the reactive ion etching conditions, the type and flow rate of etching gas and additive gas are important. It is not as effective to change the etching pressure and the high frequency power.

The reason why the etching rate changes depending on the groove width may be explained as follows. An etching gas is decomposed in plasma, and etching of an insulating film such as $SiO_2$ takes place competitively with deposition of products. An etching rate is determined depending on an equilibrium between these two reactions. The products are easy to deposit in a small groove, and therefore, the etching rate becomes small in a small groove. It is acknowledged that the deposition rate of the products is high when the content of carbon (C) in an etching gas or additive gas is large.

Etching gas is selected from $C_4F_8$, $CHF_3$ and $CH_4$, each containing carbon and fluorine. A mixed gas thereof may also be used. It is preferable to use a gas of high carbon (C) content, such as an etching gas. When using $C_4F_8$ of high carbon content, the range in which the etching rate is proportional to the groove width is large compared to other types of gas.

It is acknowledged that, by adding a gas containing carbon, the range is expanded where the etching rate is proportional to the groove width. Alternatively, an additive gas may be selected from CO, $CH_4$ of $C_2H_6$, and mixed gas thereof may also be used.

In an etching system, parallel plate plasma etching system, magnetron RIE system, ECR (Electron Cyclotron Resonance)—RIE system, helicon wave plasma—RIE system, etc. may be used.

An interlayer insulating film to be etched is either $SiO_2$, SiN, SiON, Borophosphosilicate Glass (BPSG), Phosphosilicate Glass (PSG), Spin-on Glass (SOG), $SiO_2$ film which includes F (SiO:F) or SIN:F.

Conductive material filled in the groove is either Al, Al alloy, Cu, Cu alloy, W or Ag. AlSi, AlSiCu, AlCu, AlTi, AlPd and AlSc may be used and CuTi and CuMg may be used as the Cu alloy. These conductive materials are filled in the grooves by sputtering or CVD, followed by a re-flow process when needed.

The conductive material formed outside of the groove is removed by chemical mechanical polishing or by dry etching. The chemical mechanical polishing means are performed simultaneously by abrasive polishing and chemical polishing by dissolution.

When copper or copper alloy is used for conductive leads, they are coated with a diffusion preventive film for preventing copper from diffusing into oxide film. The diffusion preventive film is generally a metal of high melting point such as (1) tungsten W, tantalum Ta, molybdenum Mo or chromium Cr, or (2) a metal nitride such as TiN, TiWN, WN, TaN, CrN, a silicon nitride SiN, or (3) a metal oxide such as $Al_2O_3$, $Cr_2O_3$ or $TiO_2$.

As can be understood from the above detailed description, the following advantages are attained in the present invention.

First, in the manufacturing method of patterned conductor leads of a semiconductor device according to the present invention, patterned grooves are formed in an insulating film by plasma etching using an etching gas containing carbon and fluorine to which an additive gas containing carbon is added. Further, conductor leads are formed by filling each groove with conductive material. Thus, the aspect ratio remains substantially constant among the plurality of conductor leads established in the same conductor lead layer.

In the patterned conductor leads of a semiconductor device according to the present invention, the conductor leads are formed so as to have increasing height with increasing width. Therefore, variation in the aspect ratio among plural conductor leads becomes moderate when compared to the variation in width, which results in improvement in reliability.

Further, in the patterned conductor leads of a semiconductor device according to the present invention, the aspect ratio of each conductor lead is kept in the range of 0.6 to 1.6. Thereby, reliability of the conductor leads is improved.

Thereby, in the case of conductor leads containing copper coated with a diffusion preventive film, diffusion of copper into oxide film may be prevented.

Hereinafter, some examples and experimental results of the present invention are described in detail.

EXAMPLE 1

Figure 1:
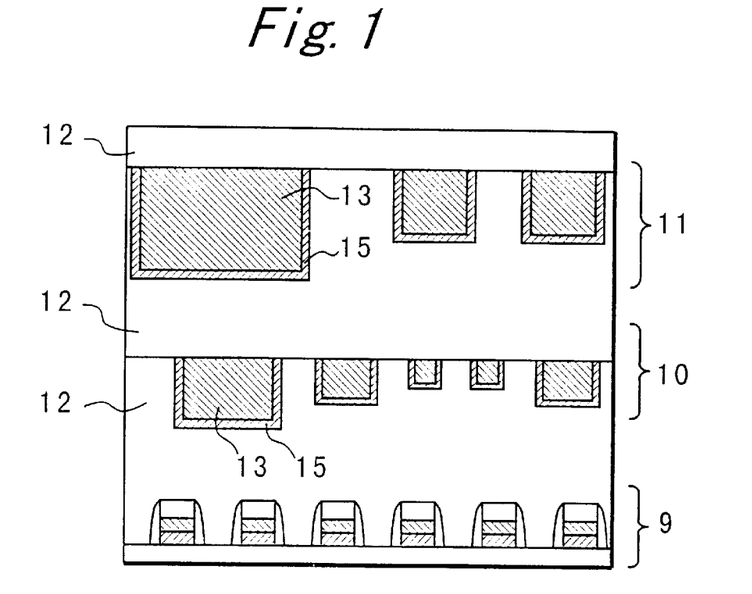
FIG. 1 illustrates a cross sectional view of a conductor lead structure of a semiconductor device according to the present invention.

FIG. 1 shows a cross sectional view showing conductor leads in a semiconductor device in accordance with the present invention. The semiconductor device includes transistors 9 formed on a Si substrate, and interlayer insulating films 12 composed of $SiO_2$. A first layer 10 of patterned conductor leads includes a plurality of conductor leads composed of principal conducting material 13 such as AlSi and an adhesion layer 15 composed of TiN. A second conductor lead layer 11 may be formed by stacking another similar structure on the first conductor lead layer 10, and a further conductor lead may be stacked on the second conductor lead layer 11.

Figure 2A:
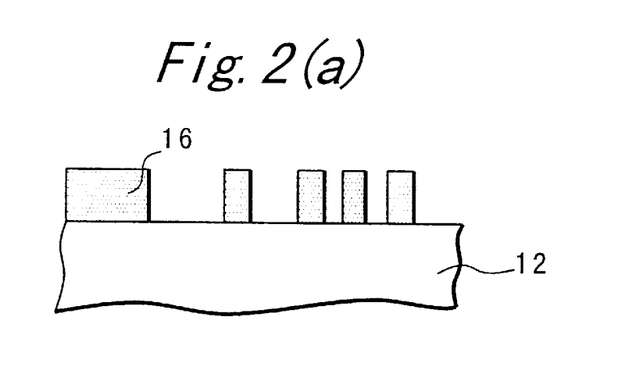
FIG. 2A, 2B, 3A, 3B, 3C, and 3D illustrate a process for manufacturing a conductor lead structure of a semiconductor device according to the present invention.
Figure 2B:
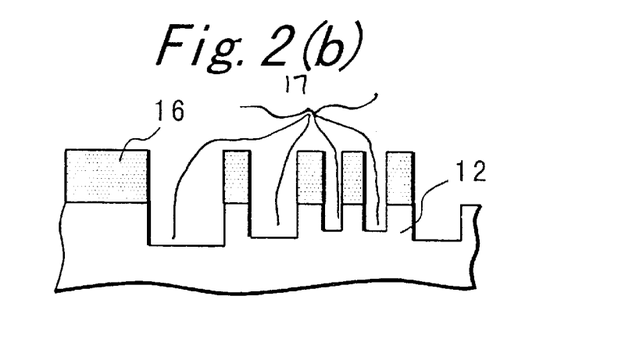

A manufacturing method of this structure is hereinafter described with reference to FIGS. 2 and 3. First, as shown in FIG. 2(a), an interlayer insulating layer composed of $SiO_2$ is formed on a silicon substrate by plasma CVD using TEOS as a material. Then, a resist mask 16 is formed thereon, and as shown in FIG. 2(b), grooves 17 of different depth are formed by RIE. A parallel plate type RIE (reactive ion etching) system may be used in the formation of the grooves 17, and a mixed gas of $C_4F_8$ and CO may be used as an etching gas.

Figure 3A:
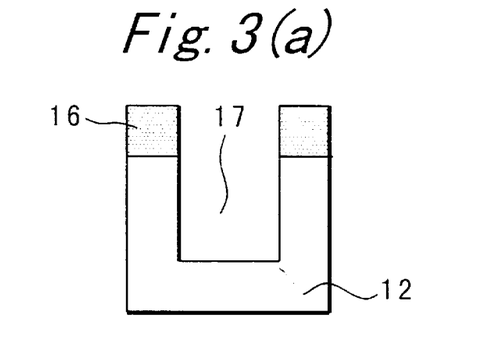
Figure 3B:
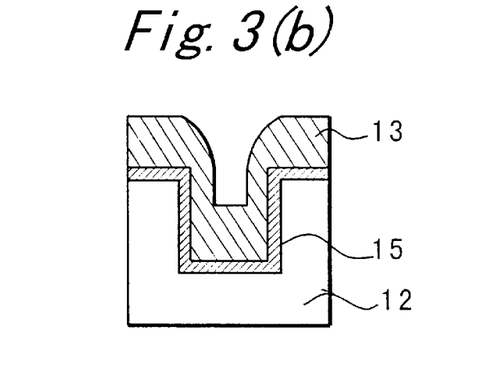
Figure 3C:
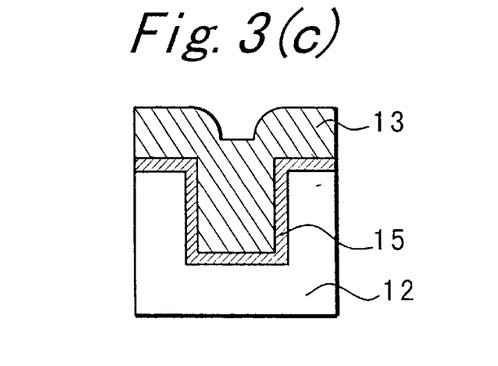
Figure 3D:
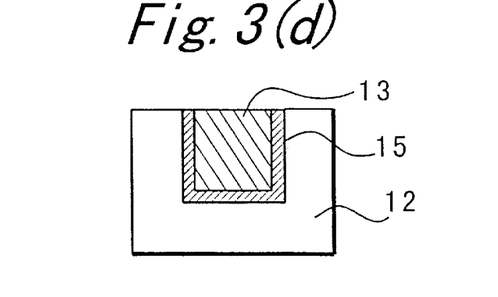

Then, a resist 16 shown in FIG. 3(a) is removed. Then, as shown in FIG. 3(b), an adhesion layer 15 of TiN film of 30 nm is formed by CVD method on the inner surfaces of the grooves 17 and on the insulating layer 12. Further, a conductive material layer 13 of AlSi alloy film is formed by sputtering, and the grooves are filled with the AlSi alloy 13 by a re-flow process as shown in FIG. 3(c). Then, TiN film and AlSi alloy film formed outside the grooves 17 are removed by chemical mechanical polishing as shown in FIG. 3(d). Slurry used in the chemical mechanical polishing may be type XJFW8099 (product name) produced by Rodel Company, to which hydrogen peroxide water is added.

Figure 4:
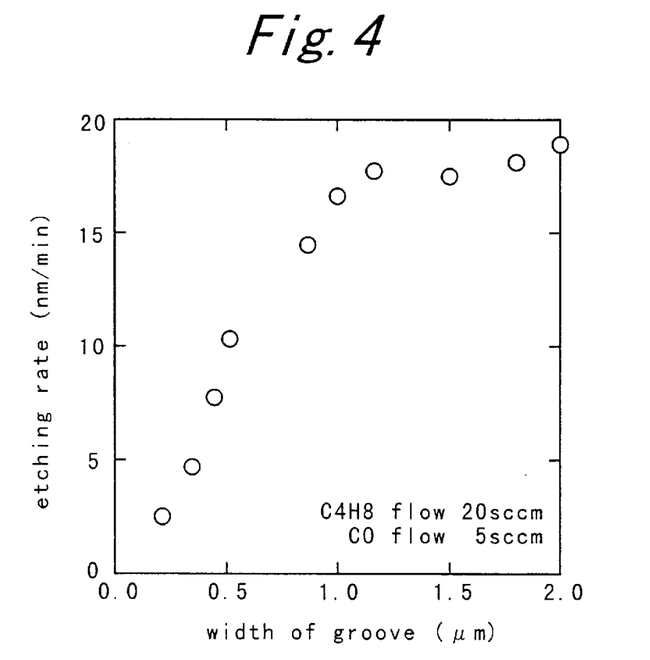
FIG. 4 shows the relation of the groove width and the etching rate in a manufacturing method of conductor leads of a semiconductor device according to the present invention.

The reactive ion etching conditions are established to be 10 Pa (75 mTorr) in pressure, 400 W in high frequency power, 20 sccm in $C_4F_8$ flow rate and 5 sccm in CO flow rate. FIG. 4 shows the relation between the width of the grooves 17 and the etching rate under the above mentioned conditions.

From FIG. 4, it is understood that the etching rate depends on the groove width, and the groove depth may be changed depending on the groove width. The etching rate for a groove width of 0.3 $\mu$m is about 0.28 times the etching rate for a groove width of 1 $\mu$m. Thus, a groove with a depth substantially proportional to the width is obtained. Where a groove width exceeds a certain value, the etching rate becomes saturated, whereas the groove depth remains almost constant irrespective of the groove width. Under the above mentioned conditions, such a constant etching rate range occurs when the groove width is larger than 1 $\mu$m.

In the experiment of the present invention under the above conditions, patterned conductor leads were prepared having a variety of widths such as 0.3, 0.4, 0.5, 0.8, 1, 2 and 5 $\mu$m. Yield of short or open circuitry between the conductor leads was evaluated with respect to these conductor leads. The same evaluation was also conducted on the conductor leads of conventional structure (formed by relative ion etching and by burying). The film thickness of the conductor leads of the conventional structure was 0.6 $\mu$m.

Table 1 shows an evaluation of yield of short or open circuitry between the conductor leads with respect to the structure of this example and the conventional structure shown in FIGS. 14 and 15. In this example, the smallest width of the conductor leads is 0.3 $\mu$m, while the largest width of the conductor leads is 5 $\mu$m. In other words, there is a large difference in the width of the conductor leads by about 17 times. However, the aspect ratio remains in the range of 0.6 to 1.6, which is moderate when compared to the large variation in the conductor lead widths. This is contrary to the conventional structure, since the film thickness is constant, i.e., 0.6 $\mu$m, irrespective of the conductor lead width. Accordingly, the aspect ratio of the conductor lead with the largest width is 0.12. That means that there is a considerably large difference in the aspect ratio between the conductor leads formed in the same layer. As a result, in the conductor leads formed by the conventional process, the yield of fine conductor leads is very poor. On the other hand, the yield of the conductor leads according to this invention are a favorable value.

TABLE 1

| Patterned conductor leads width | 0.3 | 0.4 | 0.5 | 0.8 | 1.0 | 2.0 | 5.0 |
|---|---|---|---|---|---|---|---|
| Aspect ratio of this example | 1.3 | 1.6 | 1.6 | 1.5 | 1.5 | 1.0 | 0.6 |
| Yield of this example | 98 | 100 | 100 | 100 | 100 | 100 | 100 |
| Yield of conventional structure (Fig. 14) | 0 | 0 | 78 | 98 | 100 | 100 | 100 |
| Yield of conventional structure (Fig. 15) | 41 | 78 | 100 | 100 | 100 | 100 | 100 |

EXAMPLE 2

Figure 5:
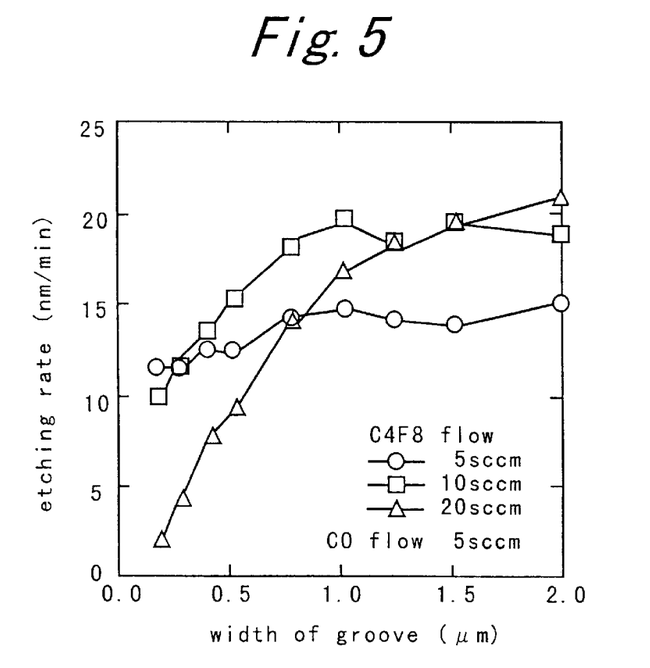
FIG. 5 hows the relation of the groove width and the etching rate in a manufacturing method of conductor leads of semiconductor device with varying parameters of etching gas flow rates according to the present invention.

FIG. 5 shows the relation between the groove width and the etching rate, when the grooves are formed by reactive ion etching using $C_4F_8$ (5 to 20 sccm in flow rate) as etching gas and CO (5 sccm in flow rate) as additive gas. The remaining manufacturing method of the conductor leads is the same as FIGS. 2 and 3.

Dependency of the etching rate on the groove width increases as the flow rate of etching gas $C_4F_8$ increases. Value of the groove width at which the etching rate becomes saturated increases as the flow rate of $C_4F_8$ increases.

EXAMPLE 3

Figure 6:
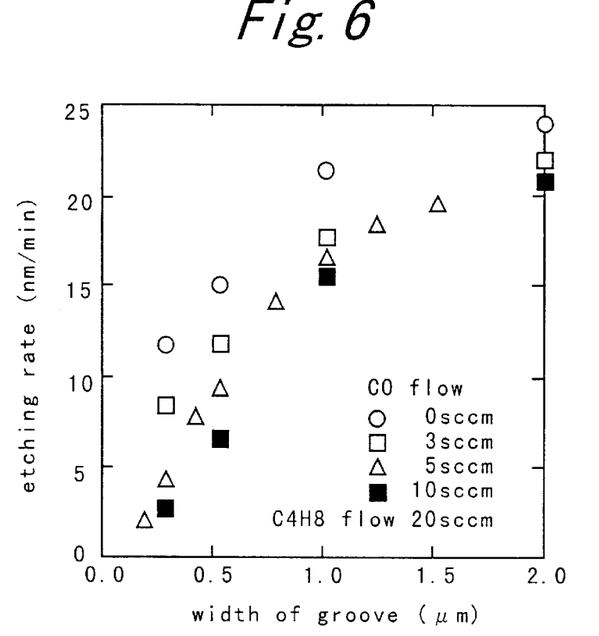
FIG. 6 shows the relation of the groove width and the etching rate in a manufacturing method of conductor leads of a semiconductor device with varying parameters of additive gas flow rates according to the present invention.

FIG. 6 shows the relation between the groove width and the etching rate, whereby grooves are formed by reactive ion etching using $C_4F_8$ (20 sccm in flow rate) as etching gas and CO (0 to 10 sccm in flow rate) as additive gas. The remaining manufacturing method of the conductor leads is the same as FIGS. 2 and 3.

If the flow rate if CO is larger than 5 sccm, the etching rate is proportional to the groove width in the range of 0.3 to 1.0 μm in the groove width.

EXAMPLE 4

Figure 7:
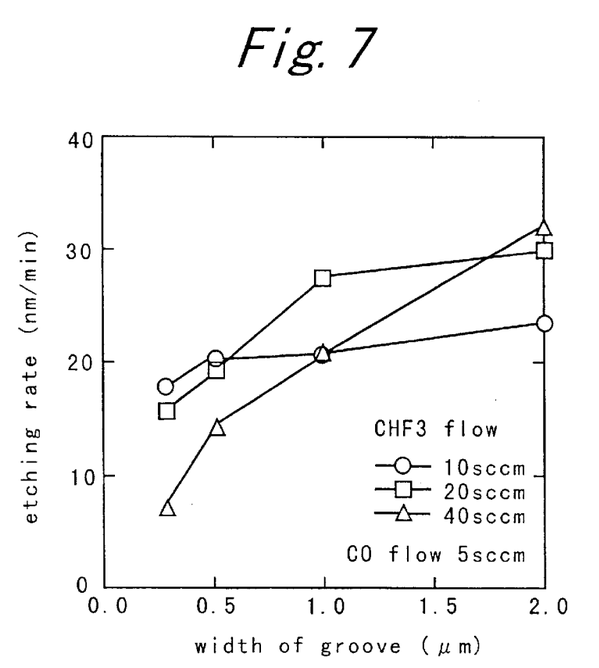
FIG. 7 shows the relation of the groove width and the etching rate in a manufacturing method of conductor leads of a semiconductor device with another etching gas according to the present invention.

FIG. 7 shows the relation between the groove width and the etching rate, whereby grooves are formed by reactive ion etching using $CHF_3$ (10 to 40 sccm in flow rate) as etching gas and CO (5 sccm in flow rate) as additive gas. The remaining manufacturing method of the conductor leads is the same as FIGS. 2 and 3.

Dependency of the etching rate on the groove width increases as the flow rate of etching gas $CHF_3$ increases. The groove width at which the etching rate becomes saturated increases as the flow rate of $CHF_3$ increases.

EXAMPLE 5

Figure 8:
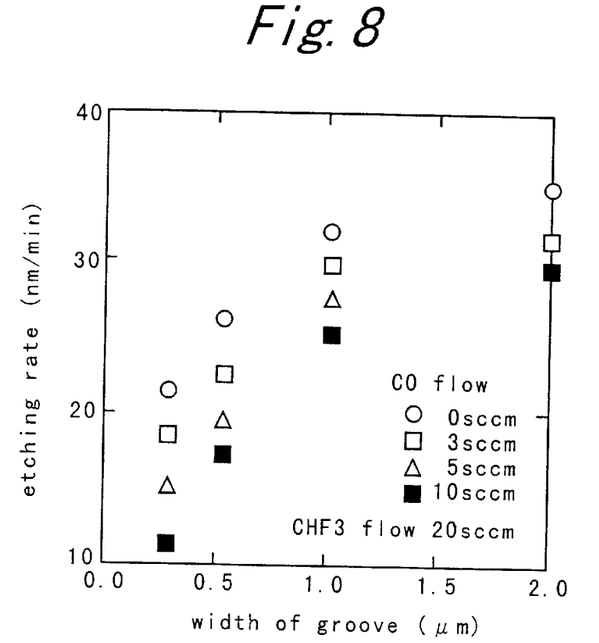
FIG. 8 shows the relation of the groove width and the etching rate in a manufacturing method of a conductor lead structure of a semiconductor device with parameters of varying additive gas flow rates according to the present invention.

FIG. 8 shows the relation between the groove width and the etching rate, whereby grooves are formed by reactive ion etching using $CHF_3$ (20 sccm in flow rate) as etching gas and CO (0 to 10 sccm in flow rate) as additive gas. The remaining manufacturing method of the conductor leads is the same as FIGS. 2 and 3.

The etching rate depends on the groove width when the groove width is not larger than 1.0 μm.

When the groove width exceeds 1.0 μm, the etching rate comes to be saturated. Dependency of etching rate on the groove width increases as the flow rate of CO increases.

EXAMPLE 6

Figure 9:
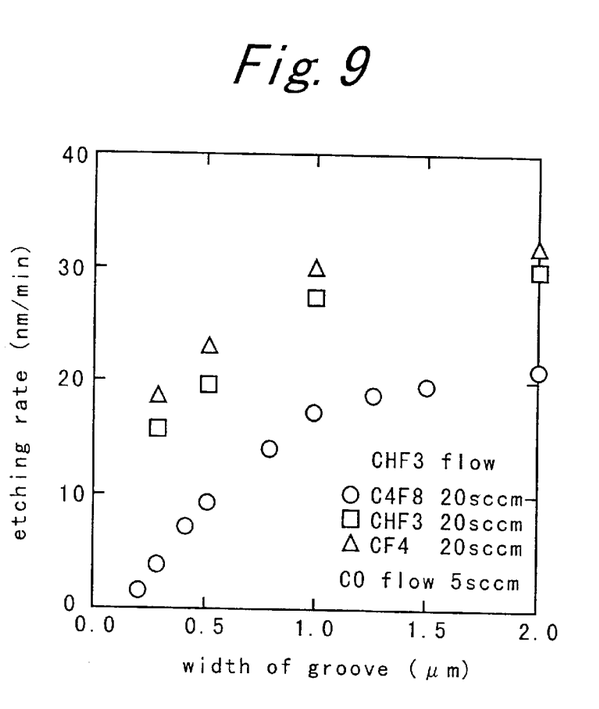
FIG. 9 shows the relation of the groove width and the etching rate in a manufacturing method of conductor leads of a semiconductor device with parameters of varying etching gas according to the present invention.

FIG. 9 shows the relation between the groove width and the etching rate, whereby grooves are formed by reactive ion etching using each of $C_4F_8$, $CHF_3$ and $CF_4$ of 20 sccm in flow rate as etching gas and CO of 5 sccm in flow rate as additive gas. The remaining manufacturing method of the conductor leads is the same as FIGS. 2 and 3.

Dependency of the etching rate on the groove width is largest when $C_4F_8$ of high carbon (C) content is used as etching gas. $C_4F_8$ of high carbon (C) content has the largest range in which dependency of the etching rate on the groove width is acknowledged.

EXAMPLE 7

Figure 10:
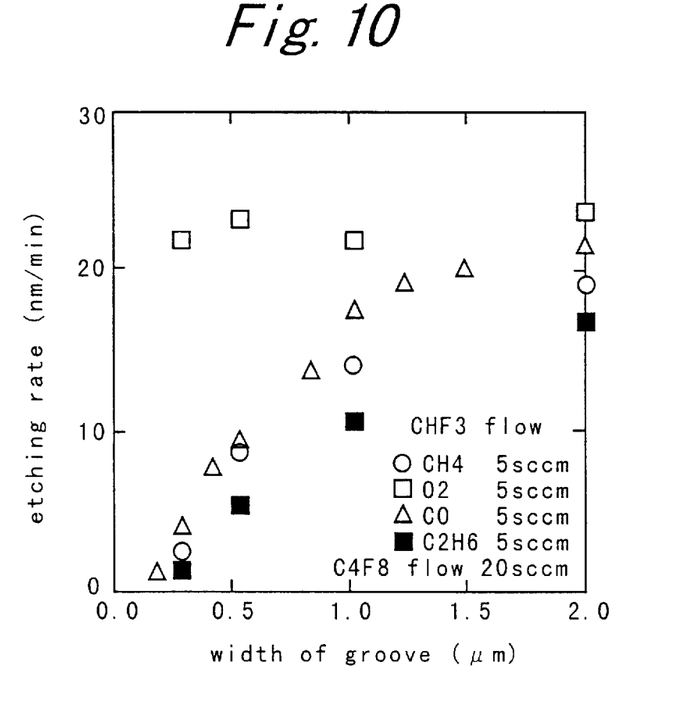
FIG. 10 shows the relation of the groove width and the etching rate in a manufacturing method of conductor leads a semiconductor device with parameters of varying additive gas according to the present invention.

FIG. 10 shows the relation between the groove width and the etching rate, whereby grooves are formed by reactive ion etching using $C_4H_8$ of 20 sccm in flow rate as etching gas and each of $CH_4$, $O_2$, CO and $C_2H_6$ of 5 sccm in flow rate as additive gas. The remaining manufacturing method of the conductor leads is the same as that shown in FIGS. 2 and 3.

$C_2H_6$ of high carbon (C) content has the largest range in which dependency of the etching rate on the groove is acknowledged. The etching rate also varies depending on the groove width when adding $CH_4$ or CO containing carbon (C), and therefore, addition of $CH_4$ or CO is also effective for causing the aspect ratio of the conductor leads to be as constant as possible. When adding $O_2$, which does not contain carbon (C), the etching rate is constant independent of the groove width.

EXAMPLE 8

A single conductor layer of AlSi alloy conductor leads having 0.3 μm width and different aspect ratios was formed according to the process shown in FIGS. 2 and 3, and a stress migration life (hereinafter referred to as "SM life") thereof was evaluated. The stress migration was evaluated in such a manner that the conductor leads were kept at 150° C. for a long time and then inspected whether or not there was any open circuit of the conductor leads. Table 2 shows the relation between the stress migration life and the aspect ratio of the conductor leads.

TABLE 2

| Aspect ratio | 0.3 | 0.4 | 0.5 | 0.6 | 0.8 | 1.0 | 1.5 | 2.0 |
|---|---|---|---|---|---|---|---|---|
| SM life (hr) | 82 | 271 | 492 | 1638 | over 2000 | over 2000 | over 2000 | 426 |

From Table 2, it is understood that the stress migration life is largely reduced when the aspect ratio is not larger than 0.5 and not smaller than 2.0. As a result, it is preferable that the aspect ratio of the conductor leads is in the range of 0.6 to 1.5. As described with regard to the foregoing Example 1, in the present invention, the aspect ratio may be kept in the range of 0.6 to 1.6 on the condition that the conductor lead width is not larger than 5 μm. The aspect ratio falls out of the range of 0.6 to 1.6 when the conductor lead width is larger than 5 μm. It is, however, to be noted that the stress migration is a serious problem only in the case of fine conductor leads, and there is almost no problem in the conductor leads having a larger width than 5 μm.

EXAMPLE 9

Figure 11:
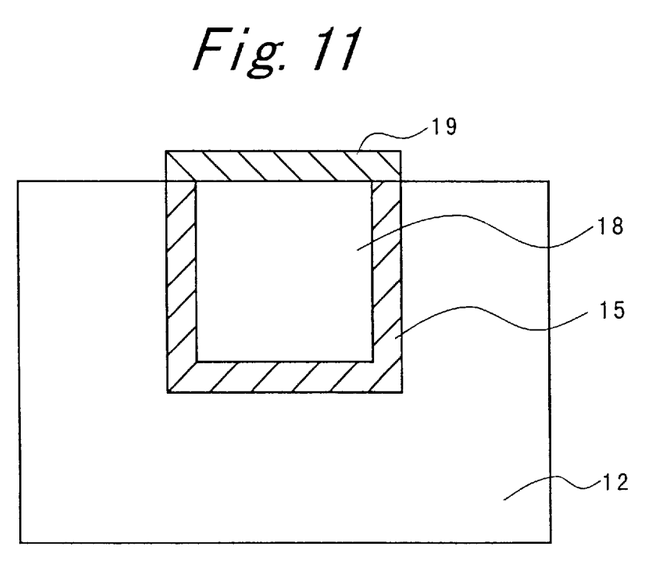
FIG. 11 illustrates a cross sectional view of a conductor lead structure of a semiconductor device according to another embodiment of the present invention.

When Cu or Cu alloy is used for conductor lead material, it is necessary to prevent diffusion of Cu into $SiO_2$. The prevention of Cu diffusion may be achieved by forming a structure in which a Cu conductor lead 18 is coated by films 15 and 19 as shown in FIG. 11.

Figure 12A:
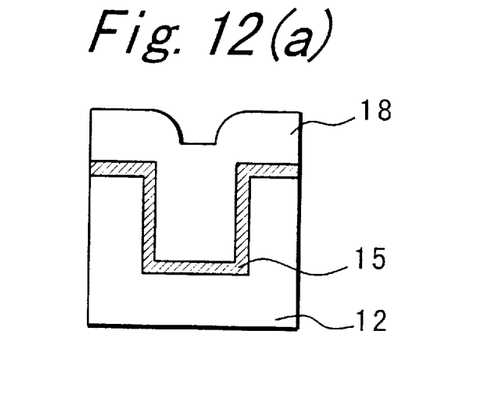
FIG. 12A, 12B, and 12C illustrate another process for manufacturing a conductor lead structure of a semiconductor device according to the present invention.
Figure 12B:
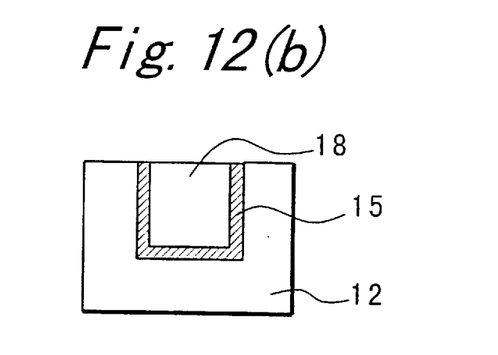
Figure 12C:
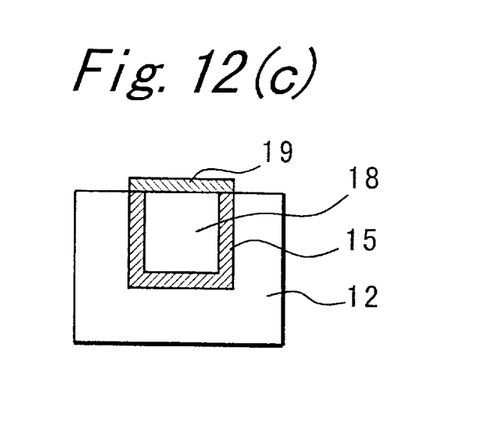

The manufacturing method of this structure is hereinafter described with reference to FIG. 12. In the same manner as the foregoing Example 1, grooves of different depth are formed on an insulating film 12 by reactive ion etching as shown in FIG. 12(a). Then, a TiN film 15 of 30 nm in thickness is formed thereon. A copper (Cu) layer 18 serving as principal conductor material is formed thereon by CVD, and each groove is filled with the Cu 18. Further, by applying a chemical mechanical polishing, TiN film and AlSi alloy film formed outside the groove are removed as shown in FIG. 12(b). Then, a tungsten (w) layer 19 is formed by selective CVD to form a diffusion preventive film on the upper side of the conductor material 18. It is acknowledged that no diffusion of Cu into $SiO_2$ takes place when there is a TiN or a tungsten (W) layer between a copper (Cu) lead and a $SiO_2$ layer. On the contrary, diffusion of copper (Cu) into $SiO_2$ layer takes place when there is no diffusion preventive film. A SIMS (secondary ion mass spectrometry) is used to measure whether or not there is any Cu diffusion.

EXAMPLE 10

Figure 13A:
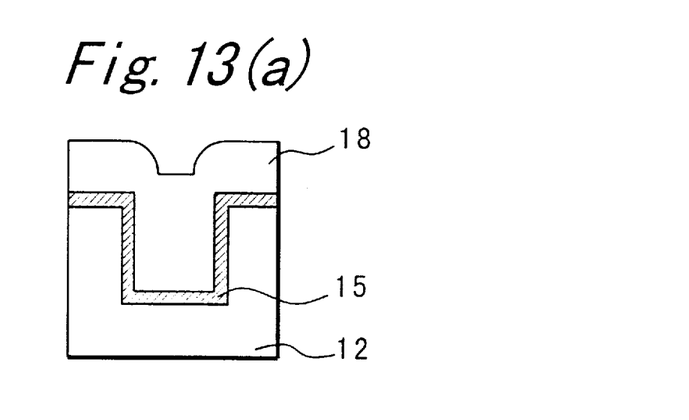
FIG. 13A, 13B, and 13C illustrate still another process for manufacturing conductor lead structure of a semiconductor device according to the present invention.
Figure 13B:
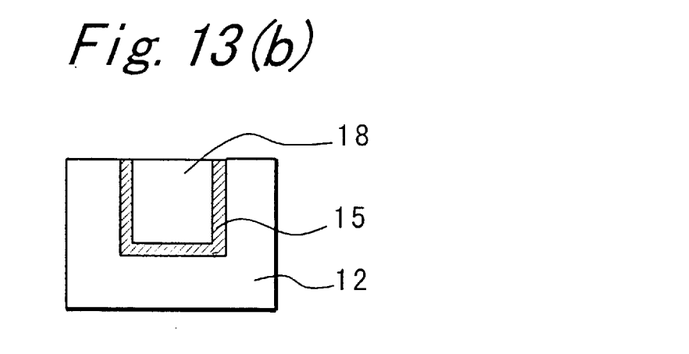
Figure 13C:
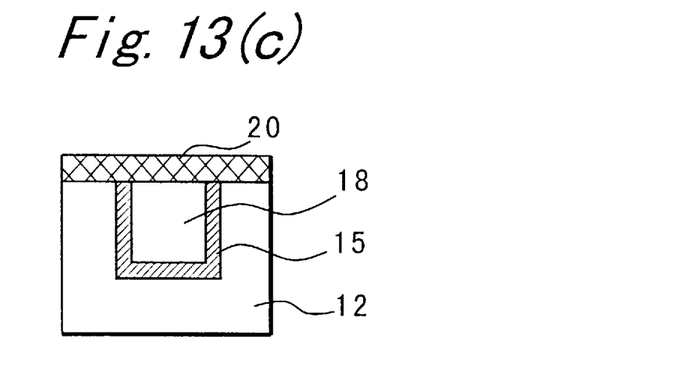

FIG. 13 shows the process of a conductor lead, in which an insulating film 20 composed of SiN is used as a diffusion preventive film for a copper conductor material. In this example, the manufacturing method is the same as the foregoing Example 9, except that SiN is used as the diffusion preventive film. First, as shown in FIG. 13(a), grooves are formed in an insulating layer 12, and adhesive layer 15 is formed on the surfaces of the groove and insulating layer 12. Then, a copper layer 18 is formed thereon. The copper layer outside of the groove is then removed. Then, a diffusion preventive layer 20 composed of SiN is formed as shown in FIG. 13(c).

Obviously, many modifications and variations of the present invention are possible in light of the above teachings. It is, therefore, to be understood that, within the scope of the appended claims, the invention may be practiced otherwise than as specifically described.

What is claimed is:

1. A semiconductor device having a plurality of patterned conductor leads formed in a single conductor lead layer, said plurality of patterned conductor leads having cross-sectional areas that differ from one another in height and width dimensions, each said conductor lead having both greater height and greater width than a respective conductor lead with a smaller cross-sectional area.

2. The semiconductor device as recited in claim 1, wherein the cross-sectional area height-to-width aspect ratios of the plurality of conductor leads are in a range of 0.6 to 1.6.

3. The semiconductor device as set forth in claim 2, wherein the width of said patterned conductor leads is in a range of 0.3 to 5.0 μm.

4. The semiconductor device as set forth in claim 1, wherein said patterned conductor leads are composed of either copper or copper alloy coated by a diffusion preventive film.

5. The semiconductor device as set forth in claim 4, wherein said diffusion preventive film is composed of a material selected from a metal of high melting point, a metal nitride, a silicon nitride or a metal oxide.

6. The semiconductor device as recited in claim 1, wherein the cross-sectional area height to width aspect ratios of the plurality of conductor leads are substantially equal to each other.

7. A semiconductor device having multiple layers, each layer having a plurality of patterned conductor leads formed in a single conductor lead layer, said plurality of patterned conductor leads having cross-sectional areas that differ from one another in height and width dimensions, each said conductor lead having both greater height and greater width than a respective conductor lead with a smaller cross-sectional area.

8. The semiconductor device as recited in claim 7, wherein the cross-sectional area height-to-width aspect ratios of said plurality of conductor leads are in a range of 0.6 to 1.6.

9. The semiconductor device as recited in claim 8, wherein the width of said patterned conductor leads is in a range of 0.3 to 5.0 μm.

10. The semiconductor device as recited in claim 7, wherein said patterned conductor leads are composed of either copper or copper alloy coated by a diffusion preventive film.

11. The semiconductor device as recited in claim 7, wherein said diffusion preventive film is composed of a material selected from a metal of high melting point, a metal nitride, a silicon nitride or a metal oxide.

12. A semiconductor device as recited in claim 7, wherein the cross-sectional area height to width aspect ratios of said plurality of conductor leads are substantially equal to each other.

13. A process for manufacturing patterned conductor leads of a semiconductor device, comprising the steps of:

forming grooves on an insulating film, via a resist mask formed thereon, by plasma etching using an etching gas containing carbon and fluorine to which an additive gas containing carbon is added; and filling said grooves with conductive material to form conductive leads.

14. The process for manufacturing patterned conductor leads of a semiconductor device as set forth in claim 13, wherein said etching gas includes at least one of $C_4F_8$, $CHF_3$ or $CF_4$ gas, and said additive gas includes at least one of CO, $CH_4$ or $C_2H_6$ gas.

15. The process for manufacturing patterned conductor leads of a semiconductor device as set forth in claim 13, further comprising the step of:

removing said conductive material formed outside of said grooves either by chemical mechanical polishing or by dry etching.

16. The process for manufacturing patterned conductor leads of a semiconductor device as set forth in claim 15, further comprising the step of:

coating the surface of said conductive material by a diffusion preventive film.

17. A semiconductor device manufactured in accordance with the manufacturing method as set forth in claim 13.

18. A semiconductor device manufactured in accordance with the manufacturing method as set forth in claim 15.

* * * * *